United States Patent
Kozlov et al.

(10) Patent No.: US 6,706,420 B1
(45) Date of Patent: Mar. 16, 2004

(54) ELECTROLESS PLATINUM-RHODIUM ALLOY PLATING

(75) Inventors: Alexander S. Kozlov, Wharton, NJ (US); Thirumalai Palanisamy, Morristown, NJ (US); Dave Narasimhan, Flemington, NJ (US)

(73) Assignee: Honeywell International Inc., Morristown, NJ (US)

( * ) Notice: Subject to any disclaimer, the term of this patent is extended or adjusted under 35 U.S.C. 154(b) by 189 days.

(21) Appl. No.: 09/611,182

(22) Filed: Jul. 6, 2000

(51) Int. Cl.$^7$ .................. B32B 15/00; B05D 1/18; C23C 18/16; C23C 18/42; C23C 18/48
(52) U.S. Cl. ................ 428/668; 428/670; 427/437; 427/443.1; 106/1.24; 106/1.28
(58) Field of Search .................. 427/125, 98, 437, 427/443.1; 106/1.24, 1.28; 428/668, 670

(56) References Cited

U.S. PATENT DOCUMENTS

| | | | |
|---|---|---|---|
| 3,486,928 A | * 12/1969 | Rhoda et al. | 117/130 |
| 3,562,911 A | 2/1971 | Walter et al. | 32/8 |
| 4,285,784 A | 8/1981 | Flinn et al. | 204/39 |
| 4,361,602 A | 11/1982 | Torikai et al. | 427/123 |
| 5,032,694 A | * 7/1991 | Ishihara et al. | 174/256 |
| 5,980,345 A | * 11/1999 | Chang et al. | 445/7 |

FOREIGN PATENT DOCUMENTS

| | | |
|---|---|---|
| DE | 2607988 A1 | 8/1977 |
| DE | 2607988 A | 8/1977 |
| JP | 58204168 A | * 11/1983 |
| JP | 204168-1983 | 11/1983 |
| JP | 80764-1984 | 5/1984 |

OTHER PUBLICATIONS

Griffith, William, et al "Gmelin Handbook of Inorganic Chemistry", Springer–Verlag; 1984; pp. 126–127; 152–153.
Lowenheim, Frederick, A.; "Modern Electroplating"; John Wiley, And Sons; pp. 710; 720–721, no date provided.

* cited by examiner

Primary Examiner—Michael Barr
(74) Attorney, Agent, or Firm—Kris T. Fredrick

(57) ABSTRACT

The present invention relates to electroless plating of a platinum-rhodium alloy onto a substrate. More particularly, this invention pertains to an aqueous platinum and rhodium plating bath, a process for plating a uniform coating of a platinum-rhodium alloy onto various substrates using an electroless plating composition, and a platinum-rhodium plated article formed therefrom. This process is suitable for the deposition of a platinum-rhodium alloy on virtually any material of any geometrical shape, including fibers and powders.

25 Claims, No Drawings

ELECTROLESS PLATINUM-RHODIUM ALLOY PLATING

BACKGROUND OF THE INVENTION

1. Field of the Invention

The present invention relates to electroless plating of a platinum-rhodium alloy onto a substrate. More particularly, this invention pertains to an aqueous platinum and rhodium plating bath, a process for plating a uniform coating of a platinum-rhodium alloy onto various substrates using an electroless plating composition, and a platinum-rhodium plated article formed therefrom.

2. Description of the Related Art

Plating of metals is a well known process employed to alter the existing surface properties or dimensions of a substrate. For example, a substrate may be plated for decorative purposes, to improve resistance to corrosion or abrasion, or to impart desirable electrical or magnetic properties to a substrate. Plating is a common practice in many industries, including the manufacture of a variety of electronic packaging substrates, such as printed circuit boards.

There are various methods of plating known in the art, including electroplating and electroless plating. Electroplating involves the formation of an electrolytic cell wherein a plating metal represents an anode and a substrate represents a cathode, and an external electrical charge is supplied to the cell to facilitate the coating the substrate.

Electroless plating involves the deposition of a metallic coating from an aqueous bath onto a substrate by a controlled chemical reduction reaction which is catalyzed by the metal or alloy being deposited or reduced. This process differs from electroplating in that it requires no external electrical charge. One attractive benefit of electroless plating over electroplating is the ability to plate a substantially uniform metallic coating onto a substrate having an irregular shape. Frequently, electroplating an irregularly shaped substrate produces a coating having a non-uniform deposit thickness because of varying distances between the cathode and anode of the electrolytic cell. Electroless plating obviates this problem by excluding the electrolytic cell. Another benefit of electroless plating over electroplating is that electroless plating is autocatalytic and continuous once the process is initiated, requiring only occasional replenishment of the aqueous bath. Electroplating requires an electrically conductive cathode and continues only while an electric current is supplied to the cell. Also, electroless coatings are virtually nonporous, which allows for greater corrosion resistance than electroplated substrates.

In general, an electroless plating bath includes water, a water soluble compound containing the metal to be deposited onto a substrate, a complexing agent that prevents chemical reduction of the metal ions in solution while permitting selective chemical reduction on a surface of the substrate, and a chemical reducing agent for the metal ions. Additionally, the plating bath may include a buffer for controlling pH and various optional additives, such as bath stabilizers and surfactants. The composition of a plating bath typically varies based on the particular goals of the plating process. For example, U.S. Pat. No. 6,042,889, teaches an electroless plating bath and having a hypophosphite reducing agent and employing one of several different "mediator ions", including rhodium and platinum ions, for the purpose of converting a non-autocatalytic metal-reduction reaction into an autocatalytic reaction to plate a substrate with copper.

Rhodium and platinum metals have been widely employed in the art of plating for their excellent physical and chemical properties. Platinum-rhodium alloys are employed as a thin coatings on substrates, in electronics, optics, fuel cells, electrical contacts, automotive catalysts, gas sensors, corrosion protection, insoluble electrodes, gas turbine engines, supported catalysts, jewelry, medical implants and many other applications. Metallic platinum-rhodium alloys provide the unique combination of excellent physical and chemical properties such as hardness, wear resistance, corrosion resistance, electrical and thermal conductivity, optical reflectance, catalytic activity and others. However, in, electroless deposition of platinum-rhodium alloy coatings is difficult because of high stability of platinum and rhodium complex ions to chemical reduction, and substantially higher stability of rhodium ions comparing to platinum ions.

U.S. Pat. No. 4,285,784 teaches a process for plating a platinum-rhodium alloy on a substrate by electroplating the metals from a bath comprising platinum and rhodium cyanide complexes in a molten cyanide bath containing a cyanide salt, such as sodium cyanide or a mixture of potassium cyanide and sodium cyanide. This plating bath is disadvantageous because of the extreme toxicity of cyanides, high cost of equipment, poor uniformity of the coating thickness, and because only thermally stable conductive substrates are sufficient for the process. U.S. Pat. No. 3,671,408 provides a rhodium-platinum plating bath and process comprising forming an aqueous mixture of rhodium sulfate, platinum P salt ($Pt(NH_3)_2(NO_2)_2$) and sulfamic acid. In plating a rhodium-platinum alloy, a high rhodium containing bath is used for a predominantly rhodium containing alloy, or a high platinum containing bath for an alloy having more platinum than rhodium. Also, concentrated sulfuric acid is added to the mixture to improve the density of the plated alloy. This process is also disadvantageous because of the high cost of electroplating equipment and poor uniformity of coating thicknesses.

Japanese patent JP58204168, teaches a process for electroless plating of platinum-rhodium alloy onto a substrate using an aqueous plating bath comprising a platinum and rhodium as ammine chlorides, hydroxylamine salt as a stabilizer and hydrazine as a reducing agent. This process is also disadvantageous because the accumulation of non-volatile chloride byproducts and nonconsumable elements from the plating bath lead to an impure rhodium plating and inhibit replenishment of the plating bath, leading to termination of the plating process.

It has also been found that purity of a deposited platinum-rhodium alloy is important for a number of applications like corrosion protection and catalysis. For example, U.S. Pat. No. 5,788,823 describes that the presence of 0.01 to 0.001% sulfur and phosphorus and chlorine in a noble metal corrosion protective coating reduces its protective action and the lifetime of gas turbine components by 25%. Further, chlorine impurity substantially reduces efficiency and lifetime of Pt—Rh catalysts. (See N. Cant, Catal. Today (1998), 44(14), 93–99; D. Martin, Stud. Surf. Sci Catal. (1995), 96, 801–11; H. Abderrahm, Proc.-Int. Congr. Catal., $9^{th}$ (1988), 3, 1246–52).

The present invention solves the problems of the prior art by employing a process for electroless plating of a platinum-rhodium alloy using a composition comprising an aqueous solution comprising a platinum nitrite and/or ammine-nitrite salt, a rhodium nitrite and/or ammine-nitrite salt, ammonium hydroxide as a complexing agent and hydrazine hydrate as a reducing agent. The composition of this aqueous solution is essentially free of sulfur, phosphorus, chlorine and non-volatile components that cause impure plating, allowing for improved appearance and properties of the plated alloy. Further, the process generates essentially no hazardous substances and the absence of non-volatile components avoids the accumulation of byproducts that degrade the plating bath, allowing for virtually unlimited replenishment of the bath. The aqueous solution is also capable of plating non-conductive and thermally unstable substrates, and the plating equipment is simple and inexpensive. Moreover, the unique composition of the plating bath allows metallic rhodium and platinum to be precipitated from the plating bath by boiling without undesirable contaminants.

This invention provides a simple low-cost method of a deposition of high purity platinum-rhodium alloy coatings on virtually any material of any geometrical shape, including fibers and powders, by electroless autocatalytic plating. The method involves the controlled autocatalytic chemical reduction of platinum and rhodium salts by a chemical reducer with the formation of a dense uniform metallic coating of unlimited thickness selectively on the substrate surface which is contacted with a platinum-rhodium plating bath.

SUMMARY OF THE INVENTION

The invention provides an electroless plating composition comprising an aqueous solution comprising:
a) a water soluble, platinum nitrite salt or platinum ammine-nitrite salt,
b) a water soluble rhodium nitrite salt or rhodium ammine-nitrite salt;
c) ammonium hydroxide; and
d) hydrazine hydrate.

The invention also provides a process for plating a substrate comprising:
A) a) a water soluble, platinum nitrite salt or platinum ammine-nitrite salt;
b) a water soluble rhodium nitrite salt or rhodium ammine-nitrite salt,
c) ammonium hydroxide; and
d) hydrazine hydrate; and
B) contacting a substrate with the plating solution for a sufficient time and under conditions sufficient to plate a metallic platinum-rhodium alloy onto the substrate.

The invention further provides a process for plating a substrate comprising:
A) providing a plating composition comprising an aqueous solution comprising:
a) a water soluble, platinum nitrite salt or platinum ammine-nitrite salt;
b) a water soluble rhodium nitrite salt or rhodium ammine-nitrite salt;
c) ammonium hydroxide; and
d) hydrazine hydrate; and
B) immersing a substrate into the plating composition for a sufficient time and under conditions sufficient to plate a metallic platinum-rhodium alloy onto the substrate; and
C) removing the substrate from the plating composition.

The invention still further provides an article comprising a substrate immersed in a composition comprising an aqueous solution comprising:
a) a water soluble, platinum nitrite salt or platinum ammine-nitrite salt;
b) a water soluble rhodium nitrite salt or rhodium ammine-nitrite salt;
c) ammonium hydroxide; and
d) hydrazine hydrate.

DETAILED DESCRIPTION OF THE PREFERRED EMBODIMENTS

The present invention provides a process for uniformly plating various substrates with an alloy comprising metallic rhodium and metallic platinum using an electroless plating bath. The term alloy as used herein is intended to describe a codeposition of metallic rhodium and platinum, as opposed to separate depositions or platings of the two metals. Thus, a single metal layer comprising a combination of metallic platinum and metallic rhodium is obtained rather than two individual and separate layers.

The aqueous plating bath is formed by combining water, a water soluble, platinum nitrite salt or platinum ammine-nitrite salt; a water soluble rhodium nitrite salt or rhodium ammine-nitrite salt; ammonium hydroxide; and hydrazine hydrate.

Preferably the water soluble, platinum nitrite salt or platinum ammine-nitrite salt has the formula $M_z[Pt(NH_3)_x(NO_2)_{(4-x)}](NO_2)_y$, wherein x=0 to 4, y≧0, z≧0 and M comprises an alkali metal or $NH_4^+$ cation. The cation is preferably sodium, potassium or ammonium $NH_4^+$. The preferred platinum compound is diamminebis(nitrito-N,N) platinum (II), or $Pt(NH_3)_2(NO_2)_2$, Chemical Abstracts Service (CAS) Registry Number 14286-02-3. In literature this salt sometimes is referred as diammninedinitroplatinum, or P-salt, or diammineplatinum (II) nitrite. This salt exists as cis- and trans-isomer. Both isomers can be employed. This salt can be synthesized by reacting an $Pt(NH_3)_2Cl_2$ aqueous suspension with $NaNO_2$. A solution of $Pt(NH_3)_2(NO_2)_2$ is commercially available from Alfa Aesar.

Preferably the water soluble, rhodium nitrite salt or rhodium ammine-nitrite salt has the formula $M_z[Rh(NH_3)_x(NO_2)_{(6-x)}](NO_2)$ wherein x=0 to 6, y≧0, z≧0 and M comprises an alkali metal or $NH_4^+$ cation. The cation is preferably sodium, potassium or ammonium $NH_4^+$. Another preferred rhodium compound is triarmminetris(nitrito-N,N,N)rhodium(II), or $Rh(NH_3)_3(NO_2)_3$, CAS Registry Number 102129-82-8. $Rh(NH_3)_3(NO_2)_3$ can be synthesized by reaction of $K_3[Rh(NO_2)_3Cl_3]$ with ammonium hydroxide. Alternatively, rhodium salt diammonium sodium hexanitrorhodate (III), or $(NH_4)_2Na[Rh(NO_2)_6]$ can be synthesized by reaction of $Na_3[Rh(NO_2)_6]$ with $NH_4Cl$ (See Gmelin Handbook of Inorganic Chemistry, 8$^{th}$ Edition, Rhodium, Supplement Volume B 2, System Number 64, Springer-Verlag, Berlin, 1984, p. 118, 152). $(NH_4)_2Na[Rh(NO_2)_6]$ is commercially available from Alfa Aesar.

The preferred complexing agent is ammonium hydroxide ($NH_4OH$). The preferred complexing agent is a 28% solution of ammonium hydroxide. The preferred reducer is a hydrazine compound, most preferably hydrazine hydrate ($N_2H_4 \cdot H_2O$). Other suitable hydrazines include hydrazine chloride and hydrazine sulfate may be used, but are not preferred because of the greater probability that rhodium and/or platinum will precipitate out of the bath Accordingly, the preferred plating reaction can be described by the following general formulae:

$$Pt(NH_3)_2(NO_2)_2 + 0.5\ N_2H_4 \cdot H_2O = Pt + 2.5\ N_2 + 4.5\ H_2O \qquad (1)$$

$$Rh(NH_3)_3(NO_2)_3 + 0.75\ N_2H_4 \cdot H_2O = Rh + 3.75\ N_2 + 6.75\ H_2O \qquad (2)$$

wherein equation (1) describes the platinum component of the bath and equation (2) describes the rhodium component.

The amount of the platinum compound present in the bath preferably ranges from about 0.01 to about 450 g/L, more preferably, from about 0.1 to about 5 g/L. The amount of the rhodium compound present in the bath preferably ranges from about 0.01 to about 320 g/L, more preferably, from about 0.1 to about 5 g/L. The quantities of each of the diamminebis(nitrito-N,N)platinum (II) and triamnninetris (nitrito-N,N,N)rhodium(III) may be regulated to add either more platinum or more rhodium to the alloy plating as desired. The amount of 28% ammonium hydroxide present in the bath preferably ranges from about 1–1000 mL/L, more preferably from about 10 to about 500 mL/L. The preferred amount of hydrazine hydrate present ranges from about 0.01 to about 240 g/L, more preferably from about 0.1 to about 10 g/L.

Once all of the components are combined in a suitable container, the water soluble platinum compound dissolves, releasing platinum ions into the bath, and the water soluble rhodium compound dissolves, releasing rhodium ions into the bath. The ammonium hydroxide complexing agent forms a strong complex with the ions and prevents chemical reduction of the ions in the bath while permitting selective chemical reduction on a substrate surface. The hydrazine hydrate reducer allows reduction of the rhodium and platinum ions to metallic platinum and rhodium which is deposited selectively at the substrate surface because of a catalytic action of the substrate surface. In particular, after a substrate is immersed in the plating bath, the substrate surface catalyzes oxidation of the reducing agent. This oxidation causes a release of electrons that, in turn, reduces metal ions in the bath at the substrate surface. These reduced metal ions are then deposited onto the substrate and, over time, generate a metallic, platinum-rhodium alloy shell around the substrate.

Chemical reduction of the platinum compound and the rhodium compound by hydrazine hydrate results in the formation of only metallic platinum, metallic rhodium and highly volatile gaseous byproducts ($N_2$, $H_2O$ and $NH_3$) which are removed from the plating bath by evaporation. Other bath constituents, including $N_2H_4 \cdot H_2O$, are also highly volatile and can be similarly removed through evaporation. The bath contains essentially no substances capable of accumulating in the container and suppressing the plating process, and creates no hazardous substances. The plating composition is highly stable and does not require the addition of non-volatile stabilizers, accelerators, pH regulators or other chemical agents used to enhance plating properties. Also, because no strong complexing agents are included or generated by the bath, simple boiling of the bath is sufficient to precipitate virtually pure rhodium and platinum from the aqueous solution.

The process is autocatalytic, in that no catalyst separate from the aforementioned components is required to advance the alloy deposition on a catalytically active surface like base and noble metals, alloys, graphite and others. Catalytically inactive materials like glass, ceramics and polymers can be activated by conventional methods, for instance by contacting with a tin salt solution and/or a noble metal solution. Additionally, the process is continuous and may be maintained for virtually an infinite time by merely replenishing each of the components of the bath.

The bath is maintained at a temperature ranging from about 20° C. to about 98° C., more preferably from about 60° C. to about 90° C. The bath is also maintained at a preferred pH ranging from about 8 to about 13. Preferably, the bath is formed in the absence of any other additives since such would tend to accumulate in the bath. These conditions are important factors in maintaining a stable plating bath and preventing precipitation of platinum or rhodium from the bath.

Following formation of the plating bath, a suitable substrate is immersed in the bath for plating. The substrate remains in the plating solution for a time sufficient and under conditions sufficient to plate a substantially uniform coating of the metallic alloy of required thickness onto the substrate. Usually the plating rate is about 0.1 to 2 micron/h. It increases with increasing temperature and concentration of platinum and/or rhodium and hydrazine. Typically the substrate remains in the plating bath for from about 1 minute to about four hours depending on the required coating thickness, preferably from about 5 minutes to about 60 minutes and most preferably from about 5 minutes to about 30 minutes.

After the desired amount of the metal alloy has been coated on the substrate, it is removed from the plating solution. The result is an article having a substantially uniform and virtually pure metallic platinum-rhodium alloy plating, having good appearance and properties. Plating can also be done by contacting a substrate surface with a plating bath by any other technique such as spraying, pouring, brushing, etc. The substrate may comprise any material ranging from non-metals, metals, alloys, semiconductors and non-conductors. Suitable metal substrates include stainless steel, carbon steel, nickel, iron, chromium, iron-chromium alloys, and nickel-chromium-iron alloys. Suitable non-metals include printed circuit boards, polyimide substrates, ceramic and glass substrates.

The type of container used to form the plating bath is also an important factor affecting the stability of the bath. In particular, the container should be non-metallic to prevent reduction of the metal ions on the walls of the container. Additionally, means used to heat the bath should be a non-metallic heating system, and should heat the bath uniformly to prevent any reductions of metal ions in the bath.

The following non-limiting examples serve to illustrate the invention.

EXAMPLE 1

An electroless platinum-rhodium (Pt—Rh) plating bath containing 20 weight (wt.) % Rh in a Pt+Rh mixture, was prepared by dissolving 1.6 g/L Pt as $Pt(NH_3)_2(NO_2)_2$, 0.4 g/L rhodium as $(NH_4)_2Na[Rh(NO_2)_6]$, 200 mL/L $NH_4OH$ and 1 g/L $N_2H_4 \cdot H_2O$. A sample of Inconel X750 foil 32×25×0.125 mm was cleaned by a sandpaper Grit 600 and immersed for 45 minutes in an electroless Pt—Rh plating bath at 75° C. A dense uniform Pt—Rh coating of 0.8 micrometers (micron) thick was obtained. According to analysis by atomic absorption spectroscopy (AAS), Rh content in the coating was 5.7 wt. %. This Pt—Rh coating is useful as a low friction wear resistant coating.

EXAMPLE 2

An electroless Pt—Rh plating bath containing 60 wt. % Rh in a Pt+Rh mixture, was prepared by dissolving 0.8 g/L Pt as $Pt(NH_3)_2(NO_2)_2$, 1.2 g/L rhodium as $(NH_4)_2Na[Rh(NO_2)_6]$, 200 mL/L $NH_4OH$ and 1 g/L $N_2H_4 \cdot H_2O$. A sample of Inconel X750 foil 32×25×0.125 mm was cleaned by a sandpaper Grit 600 and immersed for 35 minutes in an electroless Pt—Rh plating bath at 75° C. A dense uniform Pt—Rh coating of 0.5 micron thick was obtained. According to analysis by AAS, Rh content in the coating was 13 wt. %. This Pt—Rh coating is useful as a low friction wear resistant coating.

EXAMPLE 3

An electroless Pt—Rh plating bath containing 20 wt. % Rh in a Pt+Rh mixture, was prepared by dissolving 3.2 g/L Pt as Pt(NH$_3$)$_2$(NO$_2$)$_2$, 0.8 g/L rhodium as Rh(NH$_3$)$_3$(NO$_2$)$_3$, 150 mL/L NH$_4$OH and 2 g/L N$_2$H$_4$.H$_2$O. A glass microscope slide 75×25×1 mm was cleaned by polishing with an aluminum oxide suspension, treated in an ultrasonic cleaner, sensitized by an immersion for 2 minutes into a 10 g/L tin chloride solution, rinsed with water, catalytically activated by an immersion for 2 minutes into a 1 g/L palladium chloride solution, rinsed with water and immersed for 5 minutes in an electroless Pt—Rh plating bath 75° C. A bright mirror Pt—Rh coating of approximately 0.1 micron thick was obtained. According to analysis by AAS and inductively coupled plasma spectroscopy (ICP), Rh content in the coating was 1 wt. %. According to X-ray diffraction (XRD) measurements, Pt and Rh are presented in the Pt—Rh alloy coating as a solid solution. This Pt—Rh coating is useful as a non-tarnishing mirror and electrically conductive wear resistant path for high temperature electronics.

EXAMPLE 4

Electroless Pt—Rh coatings were deposited onto glass microscope slides as in EXAMPLE 3, but from a plating bath containing 40 and 60 wt. % Rh in a Pt+Rh mixture. Bright mirror Pt—Rh coatings of about 0.1 micron thick were obtained. According to analysis by AAS-ICP, the Rh content in the coatings was 8 and 11 wt. %, respectively. According to XRD, Pt and Rh are presented in the Pt—Rh alloy coatings as a solid solution. These Pt—Rh coatings are useful as a non-tarnishing mirrors, components of thin film thermocouple, and electrically conductive wear resistant paths for high temperature electronics.

EXAMPLE 5

Electroless Pt—Rh plating baths containing 20, 40 and 60 wt. % Rh in a Pt+Rh mixture, were prepared as in EXAMPLES 3 and 4. Six Inconel X750 washers OD19× ID13×H6 mm were cleaned by a sandpaper Grit 600, activated by spraying with 0.1% Pt(NH$_3$)$_2$(NO$_2$)$_2$ solution, heat treated in argon with 5 vol. % hydrogen at 600° C. for 30 min, and immersed in Pt—Rh plating baths (2 washers in each bath) for 3 hours at 75–80° C. Dense, uniform and highly adherent Pt—Rh coatings of 4–6 micron thick were obtained. Rh content in Pt—Rh coatings was about 1, 8 and 11 wt. %, respectively. These Pt—Rh coatings withstand a heat treatment at 650° C. without cracking, blistering or delamination. Such Pt—Rh coatings are useful as high temperature, low friction, wear and corrosion resistant layers.

EXAMPLE 6

A titanium coupon 55×25×0.89 mm was polished by a sandpaper Grit 400, etched in 1:1 HCL at 85° C. for 8 minutes and immersed for 2.5 hours in an electroless Pt—Rh plating bath of EXAMPLE 4 containing 40 wt. %Rh in a Pt+Rh mixture at 80–85° C. A dense semi-bright Pt—8 wt. %Rh coating of 3 microns thick was obtained. This rhodium coating is useful as an insoluble electrode.

EXAMPLE 7

A piece of a honeycomb cordierite ceramic monolith Mg$_2$AL$_4$Si$_5$O$_{18}$ 25×25×12 mm was degreased by a heat treatment at 600° C. for 30 minutes, sensitized by an immersion for 2 minutes into 10 g/L tin chloride solution, rinsed with water, catalytically activated by an immersion for 2 minutes into a 1 g/L palladium chloride solution, rinsed with water and immersed for 30 minutes in an electroless Pt—Rh plating bath of EXAMPLE 3 containing 20 wt. %Rh in a Pt+Rh mixture at 80° C. A black gray uniform Pt—1 wt. %Rh coating of about 0.3 micron thick was obtained. This Pt—Rh coating is useful as a supported catalyst for automotive catalytic converters and for ozone decomposition in aircraft cabin air.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. An electroless plating composition comprising an aqueous solution consisting essentially of:
   a) a water soluble, platinum nitrite salt or platinum ammine-nitrite salt;
   b) a water soluble rhodium nitrite salt or rhodium ammine-nitrite salt;
   c) ammonium hydroxide; and
   d) hydrazine hydrate.

2. The composition of claim 1 wherein the water soluble, platinum nitrite salt or platinum ammine-nitrite salt has the formula M$_z$[Pt(NH$_3$)$_x$(NO$_2$)$_{(4-x)}$](NO$_2$)$_y$ wherein x=0 to 4, y$\geq$0, z$\geq$0 and M comprises an alkali metal or NH$_4^+$ cation.

3. The composition of claim 1 wherein the water soluble, rhodium nitrite salt or rhodium ammine-nitrite salt has the formula, M$_z$[Rh(NH$_3$)$_x$(NO$_2$)$_{(6-x)}$](NO$_2$)$_y$ wherein x=0 to 6, y$\geq$0, z$\geq$0 and M comprises an alkali metal or NH$_4^+$ cation.

4. The composition of claim 1 wherein the platinum compound comprises diamminebis(nitrito-N,N)platinum (II).

5. An electroless plating composition comprising an aqueous solution comprising:
   a) a water soluble, platinum nitrite salt or platinum ammine-nitrite salt;
   b) a water soluble rhodium nitrite salt or rhodium ammine-nitrite salt;
   c) ammonium hydroxide; and
   d) hydrazine hydrate;
      wherein the rhodium compound comprises triamminetris(nitrito-N,N,N)rhodium(III).

6. An electroless plating composition comprising an aqueous solution comprising:
   a) a water soluble, platinum nitrite salt or platinum ammine-nitrite salt;
   b) a water soluble rhodium nitrite salt or rhodium ammine-nitrite salt;
   c) ammonium hydroxide; and
   d) hydrazine hydrate:
      wherein the platinum compound comprises diamminebis(nitrito-N,N)platinum (II) and wherein the rhodium compound comprises triamminetris(nitrito-N,N,N)rhodium(III).

7. The composition of claim 4 wherein the diamminebis (nitritro-N,N) platinum (II) is present in an amount ranging from about 0.01 to about 450 g/L.

8. The composition of claim 5 wherein the triamminetris (nitrito-N,N,N)rhodium(III) is present in an amount ranging from about 0.01 to about 320 g/L.

9. The composition of claim 1 wherein ammonium hydroxide is present in an amount ranging from about 1 to about 1000 mL/L.

10. The composition of claim 1 wherein hydrazine hydrate is present in an amount ranging from about 0.01 to about 240 g/L.

11. A process for plating a substrate comprising:
   A) providing a plating composition comprising an aqueous solution consisting essentially of:
      a) a water soluble, platinum nitrite salt or platinum ammine-nitrite salt;
      b) a water soluble rhodium nitrite salt or rhodium ammine-nitrite salt;
      c) ammonium hydroxide; and
      d) hydrazine hydrate; and
   B) contacting a substrate with the plating composition for a sufficient time and under conditions sufficient to plate a metallic platinum-rhodium alloy onto the substrate.

12. The process of claim 11 wherein the composition is autocatalytic.

13. The process of claim 11 wherein the substrate is uniformly plated with a metallic platinum-rhodium alloy.

14. The process of claim 11 wherein the temperature of the composition ranges from about 20° C. to about 98° C.

15. The process of claim 11 wherein the platinum compound is present in an amount ranging from about 0.01 to about 450 g/L.

16. The process of claim 11 wherein the rhodium compound is present in an amount ranging from about 0.01 to about 320 g/L.

17. The process of claim 11 wherein ammonium hydroxide is present in an amount ranging from about 1 to about 1000 mL/L.

18. The process of claim 11 wherein hydrazine hydrate is present in an amount ranging from about 0.01 to about 240 g/L.

19. The process of claim 11 which is conducted without electrolysis.

20. The process of claim 11 wherein the substrate comprises a metal.

21. The process of claim 11 wherein the substrate comprises a non-metal.

22. The process of claim 11 wherein the substrate comprises a semiconductor.

23. The process of claim 11 wherein the substrate comprises a ceramic.

24. A process for plating a substrate comprising:
   A) providing a plating composition comprising an aqueous solution consisting essentially of:
      a) a water soluble, platinum nitrite salt or platinum ammine-nitrite salt;
      b) a water soluble rhodium nitrite salt or rhodium ammine-nitrite salt;
      c) ammonium hydroxide; and
      d) hydrazine hydrate; and
   B) immersing a substrate into the plating composition for a sufficient time and under conditions sufficient to plate a metallic platinum-rhodium alloy onto the substrate; and
   C) removing the substrate from the plating composition.

25. An article comprising a substrate immersed in a composition comprising an aqueous solution consisting essentially of:
   a) a water soluble, platinum nitrite salt or platinum ammine-nitrite salt;
   b) a water soluble rhodium nitrite salt or rhodium ammine-nitrite salt;
   c) ammonium hydroxide; and
   d) hydrazine hydrate.

* * * * *